United States Statutory Invention Registration [19]

[11] Reg. Number: H655

Ackermann [43] Published: Jul. 4, 1989

[54] RADIATION HARDENING OF MISFET DEVICES

[76] Inventor: Mark R. Ackermann, 321 Montclaire NE., Albuquerque, N. Mex. 87108

[21] Appl. No.: 469,372

[22] Filed: Feb. 24, 1983

[51] Int. Cl.[4] ..... H01L 29/78; H01L 29/34

[52] U.S. Cl. ..... 357/23.15; 357/52; 357/61

[58] Field of Search ..... 357/23 I, 30, 52, 61, 357/47, 6

[56] References Cited

U.S. PATENT DOCUMENTS

| | | | |
|---|---|---|---|
| 3,258,663 | 6/1966 | Weimer | 357/6 |
| 3,287,506 | 11/1966 | Hoehnlein | 357/23 I |
| 3,556,966 | 1/1971 | Waxman et al. | 357/23 I |
| 3,585,415 | 6/1971 | Muller et al. | 357/23 I |
| 3,799,813 | 3/1974 | Danchenko | 148/1.5 |
| 4,047,214 | 9/1977 | Francombe et al. | 357/23 I |
| 4,238,758 | 12/1980 | Suzuki | 357/23 I |

*Primary Examiner*—Thomas H. Tarcza
*Assistant Examiner*—Linda J. Wallace
*Attorney, Agent, or Firm*—Bernard E. Franz; Donald J. Singer

[57] ABSTRACT

A MISFET device which typically utilizes silicon dioxide as an insulating material and which becomes inoperative under ionizing radiation conditions can be made to significantly enhance its radiation survivability by introducing crystalline zinc sulfide as an insulating material. The invention may be manufactured as one of three variations. Crystalline zinc sulfide may replace silicon dioxide as the gate insulator, the field insulator, or both the gate and field insulators.

9 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

RADIATION HARDENING OF MISFET DEVICES

RIGHTS OF THE GOVERNMENT

The invention described herein may be manufactured and used by or for the Government of the United States for all governmental purposes without the payment of any royalty.

BACKGROUND OF THE INVENTION

This invention generally relates to MIS field effect devices and in particular concerns the insulating material used between discrete transistors found in such devices.

A MIS (metal-insulator-semiconductor) device includes a semiconductor substrate, an insulating layer on the substrate, and a gate electrode disposed on the insulating layer. The insulating layer in prior art devices is usually an oxide, and the devices are usually called MOSFETs (metal-oxide-insulator field-effect-transistors). With a MOS field-effect device, additional source and drain electrodes are disposed to either side of the gate electrode and a lateral current may be caused to flow between the source and drain electrodes through application of proper bias potential to the gate electrode. Specifically, in the "enhancement" mode, application of a biased potential to the gate produces a conducting layer beneath the metal oxide allowing lateral current flow between the source and drain electrodes. In the "depletion" mode of operation, application of a bias potential to the gate electrodes produces an insulating region between the source and drain electrodes which serves to decrease current conduction.

MOS devices, when exposed to ionizing radiation such as would occur in a space environment, suffer radiation damage in the form of charge trapped in the oxide and/or at the oxide-semiconductor interface and undergo various changes in the electrical characteristics thereof. The circuits in which these MOS devices are found become unstable and in some instances are actually rendered inoperative. A MOSFET device with a substantially improved useful life when subjected to a radiation environment is sorely needed.

Prior work in this area includes U.S. Pat. No. 3,799,813 to Danchenko which discloses a technique for radiation hardening of MOS devices by the introduction of boron into the insulating oxide. While this patent is suitable for its intended purpose, it does not provide the simplicity and degree of protection that the present invention provides, nor does it involve the use of the same insulating material.

SUMMARY OF THE INVENTION

It is therefore an object of the present invention to produce a metal oxide semiconductor device which has improved survivability when exposed in a radiation environment.

Another object of the invention is to correct unstable conditions of silicon dioxide when subjected to radiation within a typical MOSFET device.

According to the invention, silicon dioxide, the typical MOSFET insulating material, is replaced, in whole or part, with a zinc sulfide compound. Zinc sulfide has the same crystalline structure of silicon but allows greater hole mobility thereby helping to reduce the degradation normally occurring under radiation conditions. The invention may be manufactured as one of three variations. Crystalline zinc sulfide may replace silicon dioxide as the gate insulator, the field insulator, or both the gate insulator and field insulator.

DETAILED DESCRIPTION OF THE INVENTION

Figure 1:
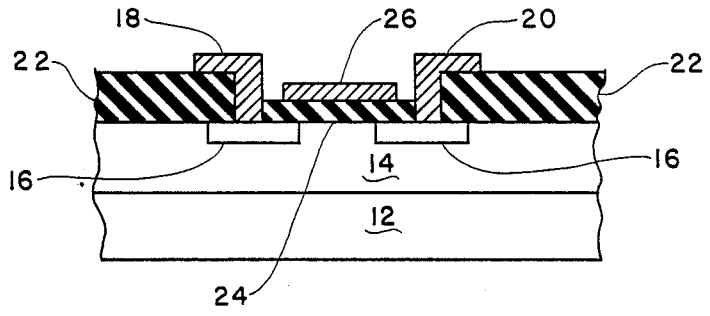
Fig. 1 PRIOR ART
FIG. 1 is a cross-sectional view of a conventional MOSFET device.

Referring to FIG. 1 of the appended drawing, a conventional N-channel MOSFET is shown which utilizes silicon dioxide as an insulating material. Typically, such a MOSFET device comprises a substrate 12 of semiconductor material such as silicon, a p-type silicon epitaxial layer 14 disposed on the semiconductor substrate into which n-type silicon 16 is implanted to form p-n transistor junctions. Drain and source regions, 18 and 20, respectively, are provided and affixed to the n-type silicon implant. A layer 22 of silicon dioxide ($SiO_2$) is placed over large areas of crystalline silicon between discrete transistors for use as a field insulator to insulate interconnecting metallization runs from the crystalline silicon. A layer 24 of silicon dioxide is also placed between a gate contact 26 for the transistor and a channel formed by the n-type silicon implants. This layer insulates the gate from the channel, yet allows the applied charge to form an electric field which enhances or depletes the channel as necessary. The $SiO_2$ gate insulator is usually much thinner than the field oxide. The problem with the use of $SiO_2$ for gate and field oxides is that $SiO_2$ is an insulator and forms an amorphous layer on top of the crystalline silicon. Ionizing radiation causes electron-hole pairs to form in the $SiO_2$. The electrons are much more mobile than the holes and diffuse away rapidly. The holes move very slowly through the $SiO_2$ and appear as a layer of trapped charge. The trapped holes produce an electric field which alters other electric fields and changes the electrical operating characteristics of the FET. Prolonged exposure to ionizing radiation destroys the device. As the holes begin to diffuse, some of them cross the $SiO_2$-Si interface and produce the little understood interface states. Interface states also cause a change in device performance and may destroy the device. One theory is that interface states are dangling bonds from the silicon into the $SiO_2$ caused by a hole passing across the interface.

Interface states and trapped charge in field oxides eventually lead to the electrical connection of adjacent devices or transistors which may adversely affect the function of the intergrated circuit. In gate oxides, trapped charge and interface states will cause shifts in the transistor threshold voltage and will eventually force it to cease normal operation.

Replacing the amorphous $SiO_2$ with crystalline material zinc sulfide allows greater hole mobility thereby helping to reduce the number of trapped holes, i.e., the quantity of trapped charge. Secondly, since the crystalline material has the same crystal structure as silicon, the problem with dangling bonds is eliminated thereby reducing the production of interface states. Therefore, zinc sulfide on silicon field effect transistors has greater radiation survivability than conventional MOSFETs.

Figure 2:
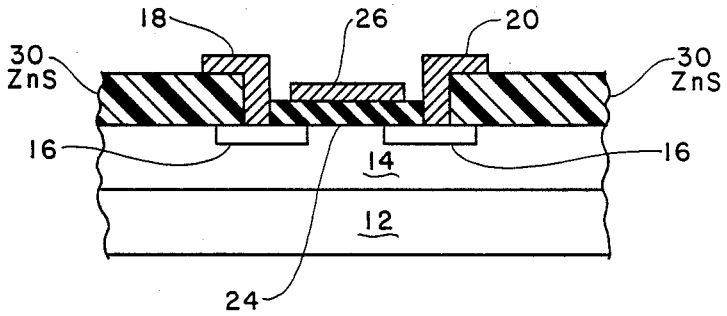
FIG. 2 is a cross-sectional view of an embodiment of the present invention in which zinc sulfide has been introduced.
Figure 3:
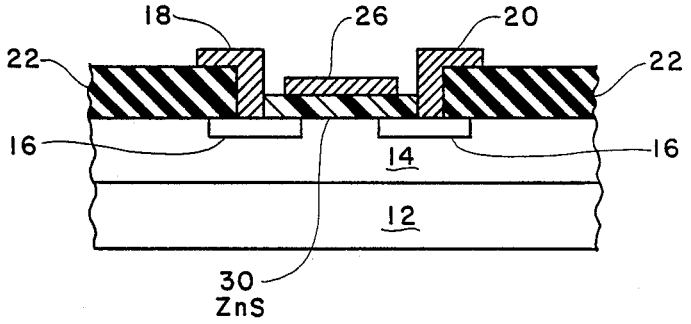
FIG. 3 is a cross-sectional view of an alternate embodiment of the present invention in which zinc sulfide has been introduced.
Figure 4:
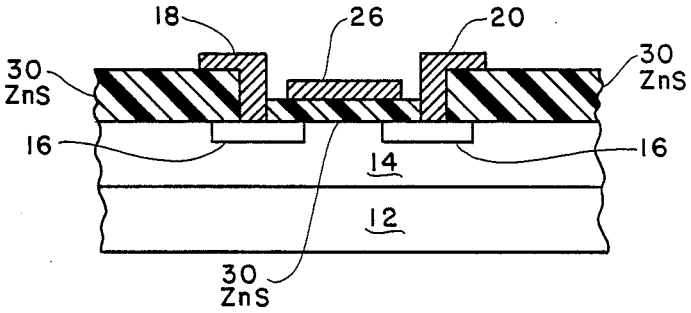
FIG. 4 is a cross-sectional view of another alternate embodiment of the present invention in which zinc sulfide has been introduced.

Referring to FIGS. 2, 3, and 4, the embodiments of the invention are shown which are substantially similar to the conventional MOSFET of FIG. 1 but zinc sulfide has been introduced as an insulating material replacing silicon dioxide. As in FIG. 1, FIGS. 2, 3, and 4 show an N-channel MOSFET, each of which is comprised of the same basic elements as FIG. 1. Namely, the MOSFET comprises a substrate 12 of semiconductor material such as silicon, a p-type silicon epitaxial layer 14 disposed on the semiconductor substrate into which n-type silicon 16 is implanted to form p-n transistor junctions. Drain and source regions, 18 and 20, respectively, are provided and affixed to the n-type silicon implant. However, the use of $SiO_2$ as the insulating material has been curtailed or abandoned according to the embodiments presented in FIGS. 2, 3, and 4. The zinc sulfide on silicon MISFET devices may be manufactured as one of three variations, FIG. 2, 3, or 4, respectively.

FIG. 2 shows a layer of zinc sulfide 30 placed over the large areas of crystalline silicon for use as a field insulator. The conventional $SiO_2$ gate insulator 24 is retained according to this embodiment.

FIG. 3 shows a layer of zinc sulfide 32 placed between the gate contact 26 and the channel formed by the n-type silicon implants 16. The conventional $SiO_2$ field insulator is retained according to this embodiment.

FIG. 4 shows a layer of zinc sulfide 32 placed between the gate contact and the channel for use as the gate insulator and also a second layer of zinc sulfide 30 placed over the large area of crystalline silicon for use as a field insulator. With this embodiment, all of the conventional $SiO_2$ insulating material has been replaced with zinc sulfide material.

Zinc sulfide (ZnS) has a zincblende crystal structure with a lattice constant of 5.42 Angstroms. Crystalline silicon has a diamond structure with a lattice constant of 5.43086 Angstroms. There is only a 0.2% variation in the lattice spacing and crystalline ZnS will continue from crystalline silicon.

Silicon has a bandgap energy of 1.12 eV. ZnS has a bandgap of 3.6 eV. The ZnS acts as a semiinsulator atop the silicon and can effectively replace $SiO_2$ as the insulator for a properly designed transistor. The advantage of crystalline ZnS atop crystalline Si is the total dose radiation survivability.

The use of zinc sulfide for gate and field insulating materials should also greatly reduce the need for costly research and development of radiation hardened field oxide processes.

Thus, while preferred constructional features are embodied in the structure illustrated herein, it is to be understood that changes and variations may be made by the skilled in the art without departing from the spirit and scope of the invention.

I claim:

1. A semiconductor device comprising a plurality of transistors on a chip, each transistor comprising:

a silicon substrate;

a silicon epitaxial layer of a first type disposed on said substrate;

at least two silicon implants of a second type implanted in said layer and separated by a distance;

at least one drain region affixed to a first of said silicon implants;

at least one source region affixed to a second silicon implant;

a first or gate insulator located on said epitaxial layer between said source and drain regions and overlapping a portion of said at least two silicon implants;

a second or field insulator located on said epitaxial layer adjacent to each source and drain regions but not between said regions, and said field insulator overlapping a portion of said silicon implants, said field insulator being means for providing the principal electrical isolation from other transistors on said chip;

a gate contact affixed above said gate insulator;

wherein at least one of said first and second insulators is crystalline zinc sulfide, formed with a continuous crystalline structure from the adjacent crystalline silicon epitaxial layer into the crystalline zinc sulfide, to thereby reduce the degradation occurring under radiation conditions.

2. The semiconductor device according to claim 1, wherein said first insulator is crystalline zinc sulfide, being means for providing d.c. electrical isolation between said epitaxial layer and the gate contact and being the only layer between them.

3. The semiconductor device according to claim 2, wherein said second insulator is silicon dioxide.

4. The semiconductor device according to claim 1, wherein said second insulator is crystalline zinc sulfide.

5. The semiconductor device according to claim 4, wherein said first insulator is silicon dioxide.

6. The semiconductor device according to claim 4, wherein said first and second insulators are both crystalline zinc sulfide, the first insulator being means for providing d.c. electrical isolation between said epitaxial layer and the gate contact and being the only layer between them.

7. The semiconductor device according to claim 6, wherein said first type is p-type and said second type is n-type.

8. The semiconductor device according to claim 6, wherein said first type is n-type and said second type is p-type.

9. The semiconductor device according to claim 7, wherein said gate insulator is thinner than said field insulator.

* * * * *